(12) United States Patent
Tu

(10) Patent No.: US 9,786,775 B2
(45) Date of Patent: Oct. 10, 2017

(54) NORMALLY-OFF HIGH ELECTRON MOBILITY TRANSISTORS AND FABRICATION METHODS THEREOF

(71) Applicants: EPISTAR CORPORATION, Hsinchu (TW); HUGA OPTOTECH INC., Taichung (TW)

(72) Inventor: Shang-Ju Tu, Taichung (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/953,240

(22) Filed: Nov. 27, 2015

(65) Prior Publication Data
US 2017/0154987 A1 Jun. 1, 2017

(51) Int. Cl.
*H01L 29/66* (2006.01)
*H01L 29/778* (2006.01)
*H01L 29/06* (2006.01)
*H01L 29/20* (2006.01)

(52) U.S. Cl.
CPC ...... *H01L 29/7787* (2013.01); *H01L 29/0653* (2013.01); *H01L 29/2003* (2013.01); *H01L 29/66462* (2013.01)

(58) Field of Classification Search
None
See application file for complete search history.

(56) References Cited

U.S. PATENT DOCUMENTS

2009/0008676 A1* 1/2009 Sato .................. H01L 29/42316
257/194

* cited by examiner

*Primary Examiner* — Robert Bachner
(74) *Attorney, Agent, or Firm* — Muncy, Geissler, Olds & Lowe, P.C.

(57) ABSTRACT

Disclosure includes a normally-off field-effect semiconductor device and the fabrication method thereof. An antigrowth portion is formed on a template. A first semiconductor layer and a second semiconductor layer on the template form two heterojunctions for creating two-dimensional electron gas regions, while a heterojunction-free area defined by the antigrowth portion separate the heterojunctions. A dielectric layer is on the second semiconductor layer and above the antigrowth portion. Two channel electrodes formed on the second semiconductor layer are electrically coupled to the two-dimensional electron gas regions respectively. A gate electrode on the dielectric layer and above the antigrowth portion is used for control of conduction between the channel electrodes.

13 Claims, 8 Drawing Sheets

NORMALLY-OFF HIGH ELECTRON MOBILITY TRANSISTORS AND FABRICATION METHODS THEREOF

BACKGROUND

The present disclosure relates generally to semiconductor devices, particularly to field-effect semiconductor devices as typified by high electron mobility transistors (HEMT), and particularly to such devices that operate normally off. The present disclosure also provides methods of fabricating such normally-off field-effect semiconductor devices.

Gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to as heterojunction field effect transistors (HFET) or high electron mobility transistor (HEMT).

A GaN HEMT includes a nitride semiconductor with at least two nitride layers of different nitride materials, formed on a substrate or a buffer, while source, drain and gate electrodes are disposed in prescribed positions on the nitride semiconductor. The difference between the two nitride materials causes the layers to have different band gaps, and form a heterojunction therebetween. Spontaneous and piezoelectric depolarizations of this heretojunction contribute to a conductive two dimensional electron gas (2DEG) region near the heretojunction, specifically in the nitride layer with the narrower band gap.

Because the 2DEG region exists under the gate at zero bias, most GaN HEMT devices are normally on, or depletion mode devices. If the 2DEG region is depleted, i.e. removed, below the gate at zero bias, the device can be an enhancement mode device. Enhancement mode devices are normally off, and are more desirable because they are easier to control with simple, low-cost driver. A normally-off device, or an enhancement-mode device, requires a positive gate bias in order to conduct current.

Attempts have been made to fabricate a normally-off HEMT, by, for example, making the nitride layer with the wider band gap thinner only under the gate electrode. By doing so, the electric field due to the depolarizations caused by the heterojunction under the gate electrode weakens, resulting in diminished electron concentration in the 2DEG region. The 2DEG region disappears just under the gate electrode, and the HEMT can be held off between drain and source electrodes while no bias voltage is applied to the gate electrode. Selective etching is normally employed to make the nitride layer thinner. The selective etching, however, likely leads to impairment of the semiconductor crystal structures of the nitride layers, and the resulting HEMTs are not necessarily satisfactory in performance.

P-type nitride material has been used to relatively raise the bands nearby the heterojunction, so the 2DEG disappears. Nevertheless, this attempt for fabricating a normally-off HEMT requires extra photo masks to define the pattern of the p-type nitride material and an associated gate electrode. These extra photo masks and related etching processes lead to wider cell pitch and higher RdsON ("ON resistance"), and also increase manufacturing costs. Furthermore, this kind of method for fabricating a normally-off HEMT needs an etching process to remove the P-type nitride material outside gate regions where the gate electrodes of normally-off HEMTs are located. The end point of this etching process is hard to control to stop before damaging active regions, however. Once over etched, active regions for normally-on HEMTs will be damaged, resulting in diminished electron concentration in the 2DEG regions therein and degraded performance in conductivity.

BRIEF DESCRIPTION OF THE DRAWINGS

Non-limiting and non-exhaustive embodiments of the present disclosure are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The present disclosure can be more fully understood by the subsequent detailed description and examples with references made to the accompanying drawings, wherein.

DETAILED DESCRIPTION

Embodiments are described with sufficient detail to enable those skilled in the art to practice them. It is to be understood that other embodiments may be employed and that various structural, logical, and electrical changes may be made.

Figure 7:
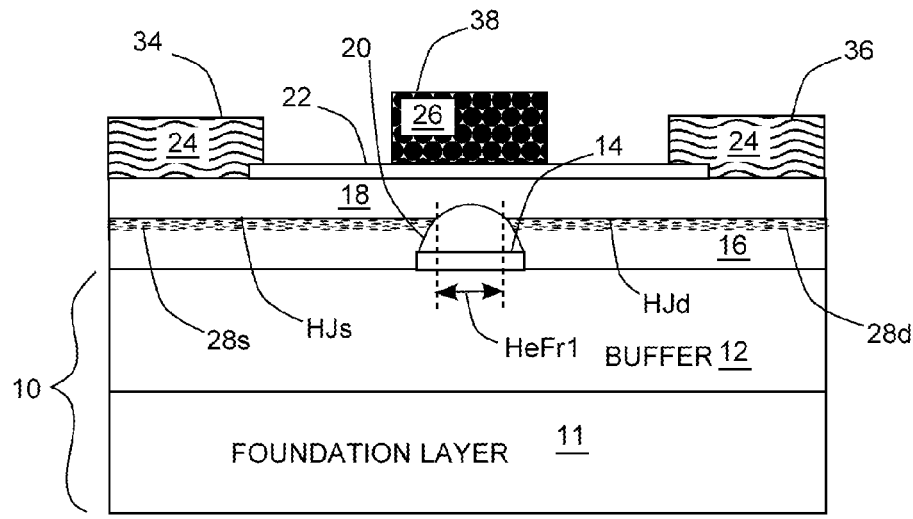

FIGS. 1-7 illustrate the sequential steps of fabricating a normally-off HEMT, where FIG. 7 shows the normally-off HEMT completed. FIGS. 1-7 are drawn on the assumption that several HEMTs are being jointly fabricated on a single template 10, even though only one normally-off HEMT is shown in FIG. 7.

Figure 1:
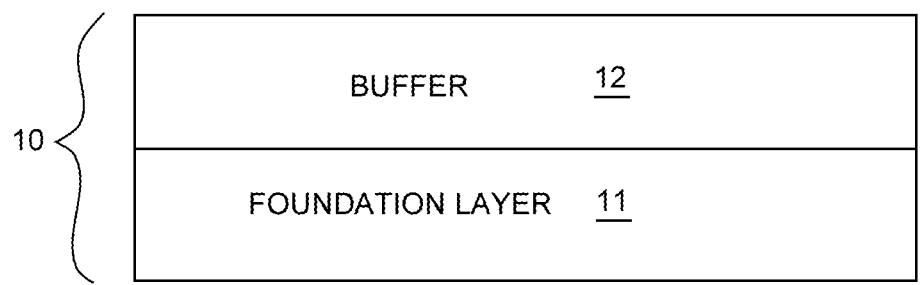
FIGS. 1-7 illustrate the sequential steps of fabricating a normally-off HEMT.

The fabrication of a normally-off HEMT starts with the template 10, as shown in FIG. 1, on which constituent layers of the HEMT are to be grown by epitaxy or deposition. The template 10 comprises a foundation layer 11 of monocrystalline silicon semiconductor and, formed thereon, a layer of semiconductor nitride, known as a buffer 12. The foundation layer 11 of the template 10 must be fit for epitaxial growth of the buffer 12 thereon and sufficiently thick to support structures of the HEMT formed subsequently thereon. The face of the foundation layer 11 confronting the buffer 12 is preferably (111) in terms of Miller indices. Materials other than silicon are suitable for the foundation layer 11, examples including semiconductors such as silicon carbide, gallium nitride, and aluminum nitride, or insulators such as sapphire and various ceramics. In practice, the buffer 12 may be a lamination of sublayers of two of aluminum nitride (AlN), aluminum gallium nitride (AlGaN) and gallium nitride (GaN) formed by any expitaxial growth methods such as metalorganic chemical vapor deposition (MOCVD). As required or desired, the buffer 12 may take the form of a desired number of alternations of AlN, AlGaN and GaN sublayers. In terms of chemical formula, the buffer 12 is composed of $Al_xIn_yGa_{1-x-y}N$, where $0 \leq x \leq 1$, $0 \leq y \leq 1$. One of the functions the buffer 12 provides is to release the stress caused by the lattice difference between the foundation layer 11 and a GaN layer, yet to be formed and described, on the buffer 12. Preferably, the buffer 12 is not uniform, and the closer a place inside the buffer to the foundation layer 11 the larger the weighting factor x of $Al_xIn_yGa_{1-x-y}N$. Groups III-V compound semiconductors other than AlN and GaN are adoptable for the buffer 12. Since the buffer 12 is not directly associated with HEMT operation, the buffer 12 is omissible altogether.

Figure 2:
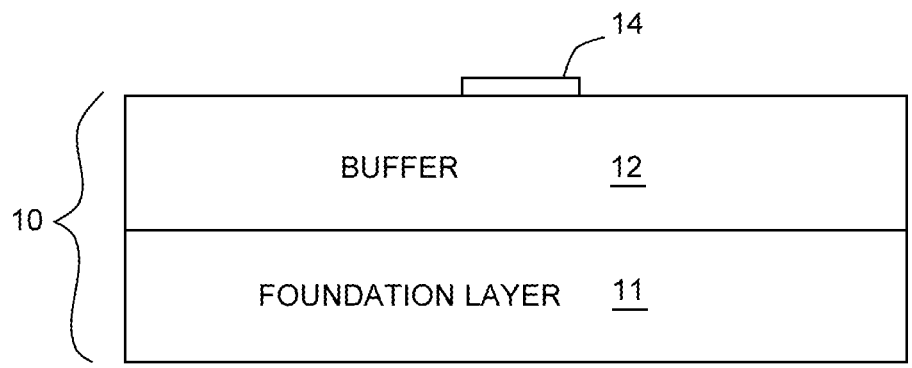

The next step is the formation of an antigrowth portion 14 on the template 10, as shown in FIG. 2. As the name implied, the antigrowth portion 14 is intended to inhibit the expitaxial growth of a nitride semiconductor on the template 10 or the buffer 12.

The antigrowth portion 14 could be made from an insulating material that can fulfill this function. For example, a film of Silica ($SiO_2$) is deposited on the entire surface of template 10 by chemical vapor deposition, and then patterned by lithography and etching to form a mask layer as the antigrowth portion 14. Other adoptable materials for the antigrowth portion 14 include $SiO_x$, where $0<x<2$, silicon nitride such as $SiON_x$, $SiN_x$ where x is an arbitrary number, $Si_3N_4$ and $Si_2N_3$, aluminum oxide ($Al_2O_3$), and aluminum nitride (AlN) grown epitaxially at low temperature.

The antigrowth portion 14 could be formed by damaging the lattice structure in a selective area of the buffer 12, nevertheless. For instance, an ion stop layer of $SiO_2$ with openings is formed on the buffer 12 by deposition, lithography and etching. Next, Si ion implantation, with dosage and energy of $5 \times 10^{15}/cm^2$ and 70 kev, respectively, is performed, so as to create a damaged region in each of the openings while the ion stop layer leads to the implanted Si ions accumulated next to the surface of the buffer 12. The area protected by the ion stop layer is referred to as an implantation-free area. The ion stop layer is then lifted or striped off. During a subsequent expitaxial growth of a semiconductor nitride on the buffer 12, the expitaxial layer is initially grown on the implantation-free area, while the deposition of the semiconductor nitride on the damaged region does not occur because the lattice constant of the damage layer differs from that of the implantation-free area. Accordingly this damaged region can be used as the antigrowth portion 14 in FIG. 2. Methods other than ion implantation are adoptable for damaging the lattice structure in a selective area of the buffer 12, examples including laser sintering which uses laser as a power source to heat a selected area so as to change the lattice constant therein.

Even though FIG. 2 shows the antigrowth portion 14 that is completely above the buffer 12, this disclosure is not limited to. For example, as aforementioned, ion implantation or laser sintering may be employed to turn a portion of the buffer 12 into the antigrowth portion 14, so the top surface of the antigrowth portion 14 might be even with or slightly above that of the buffer 12.

Figure 3:
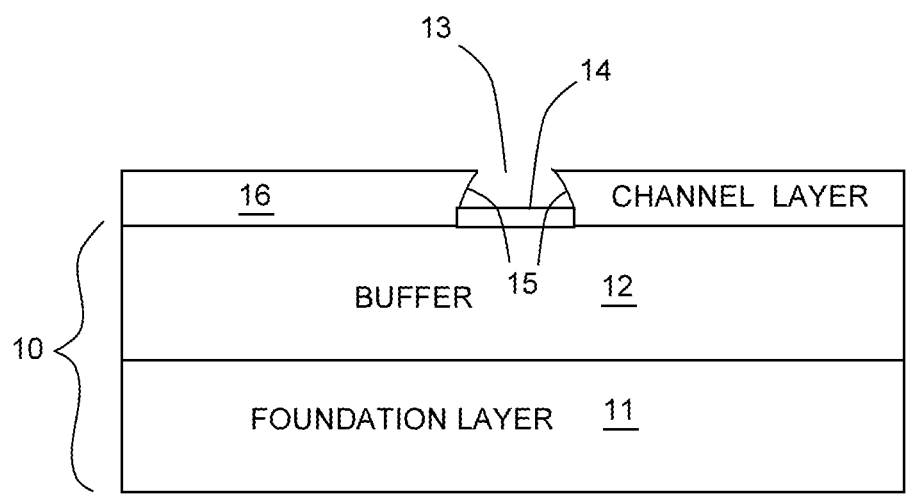
Figure 4:
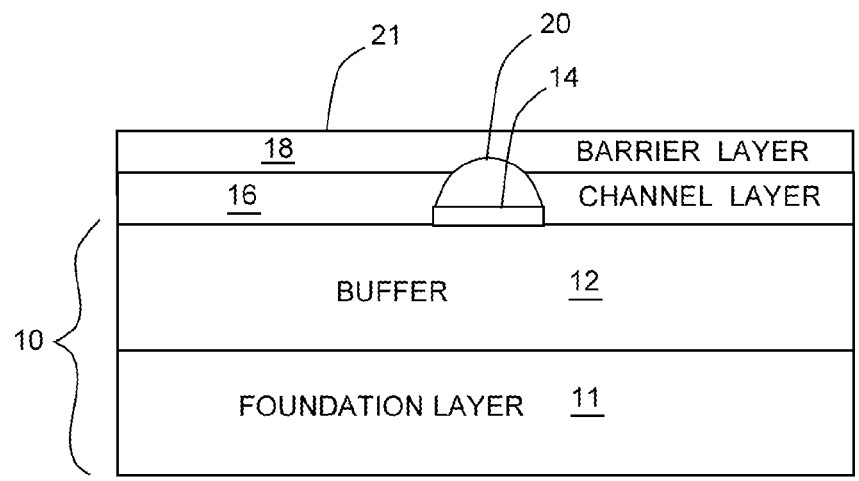

After the formation of the anti-growth portion 14, a channel layer 16 as a first semiconductor layer is expitaxially grown on the top surface of the buffer 12 as shown in FIG. 3, and a barrier layer 18 as a second semiconductor layer follows to be grown thereon, as shown in FIG. 4. Both the channel layer 16 and the barrier layer 18 can be formed by MOCVD (metal-organic chemical vapor deposition) or MOVPE (metal-organic vapor-phase epitaxy). The semiconducting material for the channel layer 16 is a semiconductor nitride, such as GaN or InGaN, and that for the barrier layer 18 is another kind of semiconductor nitride with a wider bandgap than the semiconductor nitride of the channel layer 16, such as AlGaN, AlInGaN, AlInN, AlN. In this particular embodiment, the channel layer 16 is un-doped GaN and, the barrier layer 18 is un-doped AlGaN.

Included in FIG. 4 is an air gap 20 sealed under the top surface 21 of the barrier layer 18 and above the antigrowth portion 14. As will become apparent as the description proceeds, the antigrowth portion 14 on the template 10 predetermines the position of the air gap 20.

Growth conditions, such as growth temperature, pressure, and V/III ratio, must be considered in the formation of the air gap 20 imbedded under the barrier layer 18. For instance, Tu et al discloses a method for forming an air gap embedded in a GaN layer in "Improved Output Power of InGaN LEDs by Lateral Overgrowth on Si-Implanted n-GaN Surface to Form Air Gaps", IEEE journal of Quantum Electronics, Vol. 48, No. 8, August 2012, which is incorporated herein by reference in its entirety. As shown in FIG. 3, the channel layer 16 starts to be grown from the buffer 12, but not from the antigrowth portion 14, forming an opening 13 thereon. The opening 13 has a bottom made up by the antigrowth portion 14 and sidewalls 15 made up by the channel layer 16. Growth conditions for the channel layer 16 can be chosen to perform epitaxial lateral overgrowth, so, as the thickness of the channel layer 16 increases, the top view of the opening 13 on the antigrowth portion 14 shrinks and the sidewalls 15 of the opening 13 bend inward. After the formation of the channel layer 16, the barrier layer 18 starts to be grown from the channel layer 16, as shown in FIG. 4. Grown conditions can be also chosen to further shrink the top view of the opening 13 on the antigrowth portion 14. The barrier layer 18 over the antigrowth portion 14 finally merges to close the opening 13, substantially forming a flat top surface 21, under which the air gap 20 is sealed.

Figure 5:
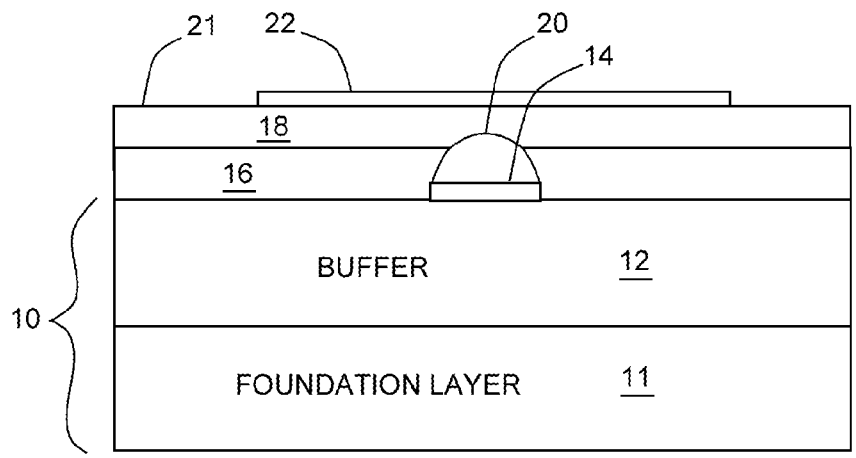
Figure 6:
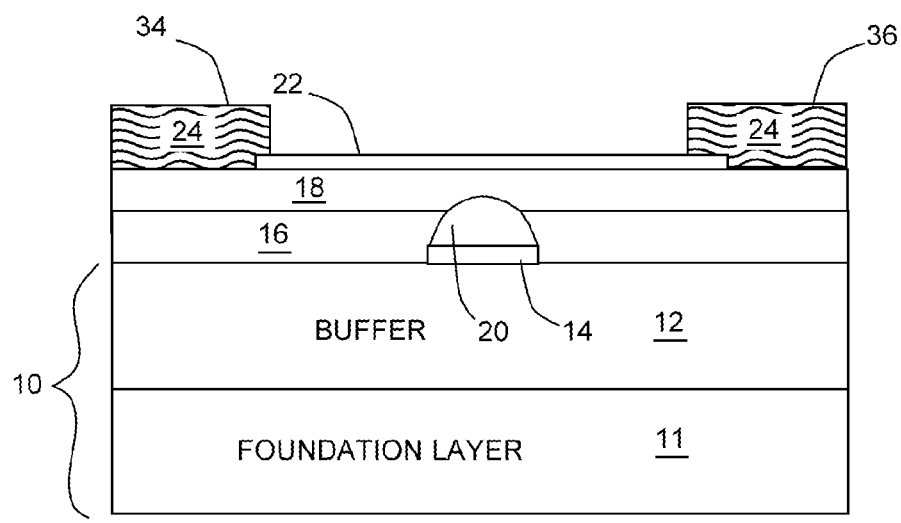

A dielectric layer 22 is then deposited and patterned on the top surface 21, as illustrated in FIG. 5. In this specific embodiment, the dielectric layer 22 is made of silicon dioxide. Processes for forming the dielectric layer 22 include CVD to uniformly deposit a silicon dioxide layer on the top surface 21, and lithography and selectively etching to remove part of the silicon dielectric layer, the rest providing the dielectric layer 22. Materials other than silicon dioxide are adoptable for the dielectric layer 22, examples including $SiON_x$, and $SiN_x$.

Then it comes the step of electroding. Shown in FIG. 6, a metal 24 is deposited and patterned to form a drain electrode 36 and a source electrode 34, which directly contacts the barrier layer 18 to form ohmic contacts thereunder. The metal 24 can be made of titanium (Ti), aluminum (Al), or a metal stack. A gate metal 26 is then deposited and patterned to form a gate electrode 38 on the dielectric layer 22, as illustrated in FIG. 7. The position of the gate electrode 38 should cover or overlay the antigrowth portion 14. The gate metal 26 can be made of a refractory metal or its compound, e.g., tantalum (Ta), tantalum notride (TaN), titanium nitride (TiN), palladium (Pd), tungsten (W), or tungsten silicide ($WSi_2$). Materials for the gate metal 26 could be chosen to form a schottky contact if it contacts the barrier layer 18 directly without the dielectric layer 22 therebetween. As shown in FIG. 7, the HEMT therein has three electrodes, consisting of a source electrode 34 and a drain electrode 36 as two channel electrodes, and a gate electrode 38 that controls the conduction between the two channel electrodes.

The barrier layer 18 and the channel layer 16 contacts to form heterojunctions HJd and HJs, creating 2DEG regions 28d and 28s respectively. Each of the 2DEG regions is within the channel layer 16 and against the barrier layer 18. As the metal 24 provides ohmic contacts to the barrier layer 18, the drain electrode 36 is electrically coupled to the 2DEG region 28d and the source electrode 34 is electrically coupled to the 2DEG region 28s. The air gap 20 separates the heterojunctions HJd and HJs. A heterojunction-free area HeFr1 denoted in FIG. 7 is defined by the antigrowth portion 14. Due to the absence of the channel layer 16, the heterojunction-free area HeFr1 has no heterojunction formed therein and separates the two heterojunctions HJd and HJs. Accordingly the 2DEG regions 28d and 28s are separated by the heterojunction-free area HeFr1, physically and electrically. Normally when there is no bias applied to the gate electrode 38, no conduction between the source electrode 34 and the drain electrode 36 exists. Therefore, the HEMT in FIG. 7 is a normally-off device.

Figure 8:
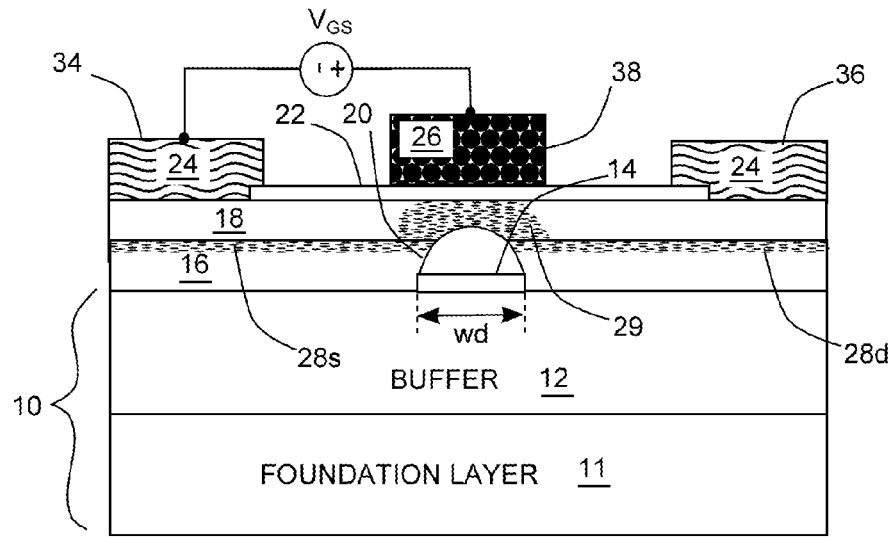
FIG. 8 shows a positive gate-to-source bias $V_{GS}$ applied between the gate electrode and the source electrode of FIG. 7.

A positive gate-to-source bias $V_{GS}$ is applied between the gate electrode 38 and the source electrode 34 in FIG. 8. The gate-to-source bias $V_{GS}$, when exceeding a threshold voltage, attracts and accumulates electrons to form an electron region 29 underneath the gate electrode 38. The electron region 29 provides a conductive path so the drain electrode 36 becomes electrically coupled to the source electrode 34 via the 2DEG region 28d, the electron region 29 and the 2DEG region 28s. The HEMT in FIG. 8 is therefore turned on.

The dielectric layer 22 isolates the gate electrode 38 from the barrier layer 18. If the dielectric layer 22 were absent, the positive gate-to-source bias $V_{GS}$ could cause direct-current leakage current flowing from the gate electrode 38 to the barrier layer 18, the 2DEG region 28s, and to the source electrode 34, because the schottky contact between the gate metal 26 and the barrier layer 18 is forward biased.

The width of the antigrowth portion 14, which is denoted as wd in FIG. 8, defines the distance between the 2DEG regions 28d and 28s. The distance between the 2DEG regions 28d and 28s can be equal to or less than the width wd. Herein, the distance between the 2DEG regions 28d and 28s is less than the width wd. The wider the width wd, the larger the RdsON, the harder for the barrier layer 18 to merge and seal the air gap 20. In consideration of the hardness of process control, it is preferred that the width wd is equal to or less than 2 micrometers. Some embodiments could employ an antigrowth portion with a width equal to or less than 100 nanometers.

Figure 9:
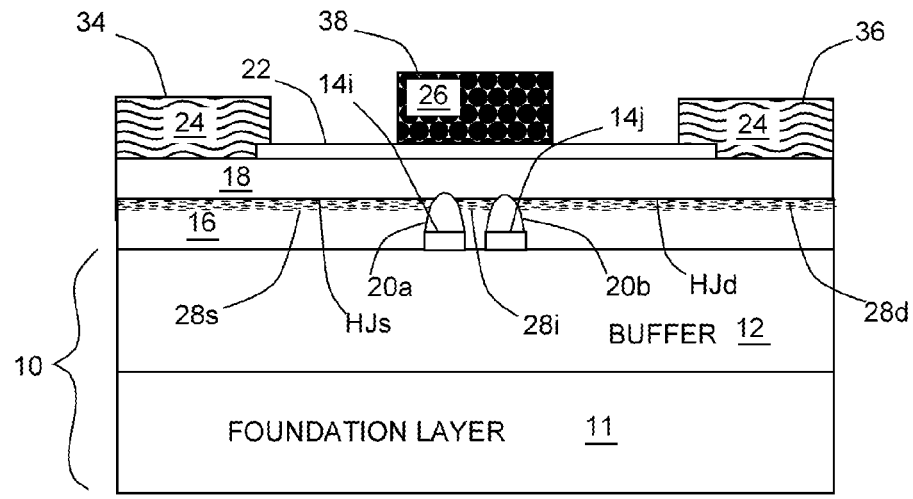
FIG. 9 demonstrates a plurality of antigrowth portions used in one normally-off HEMT.

The embodiment of FIG. 8 shows only one antigrowth portion 14 under the gate electrode 38 for a HEMT, but this disclosure is not limited to. A plurality of antigrowth portions could be used in one HEMT, as demonstrated in FIG. 9. Two antigrowth portions 14i and 14j are shown in FIG. 9, and the fabrication methods for them could be the same or similar with those for the antigrowth portion 14. Two air gaps 20a and 20b are formed above the antigrowth portions 14i and 14j, respectively. The antigrowth portions 14i and 14j also define two heterojunction-free areas respectively to separate heterojunction HJd from heterojunction HJs. Located between the air gaps 20a and 20b is an intermediate 2DEG region 28i, which is conductive and has very low resistance. Other embodiments might have more antigrowth portions and more air gaps between 2DEG regions 28d and 28s. Under the condition that the distance between the 2DEG regions 28d and 28s is kept as a constant, the more antigrowth portions, the more intermediate two-dimensional electron gas regions 28i, and the less RdsON. Beneficially, the HEMT in FIG. 9 and the HEMT in FIG. 8 are formed on the same template 10 and at the same time.

Figure 11:
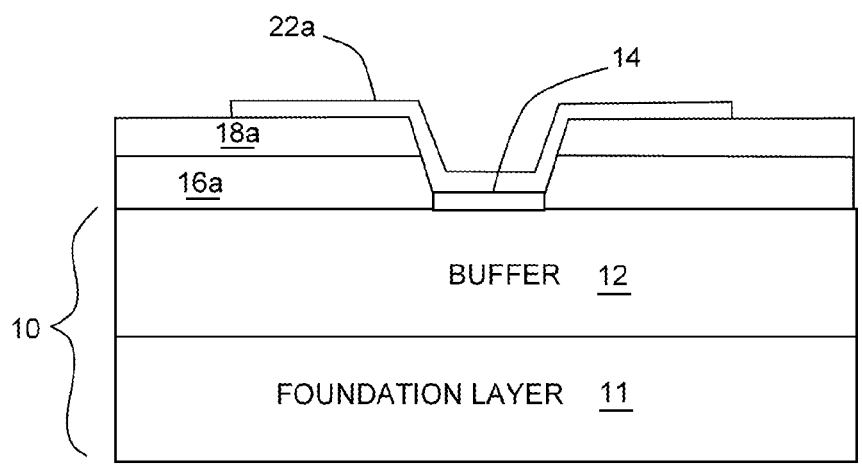
Figure 12:
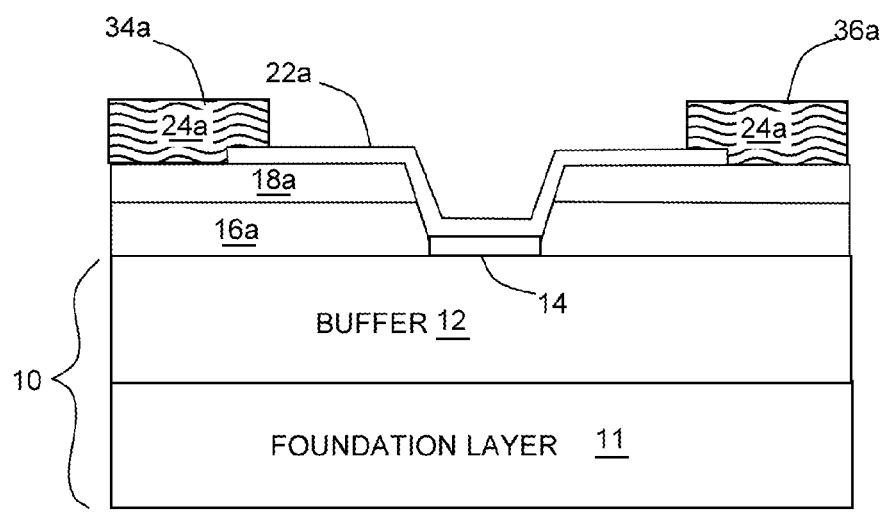
Figure 13:
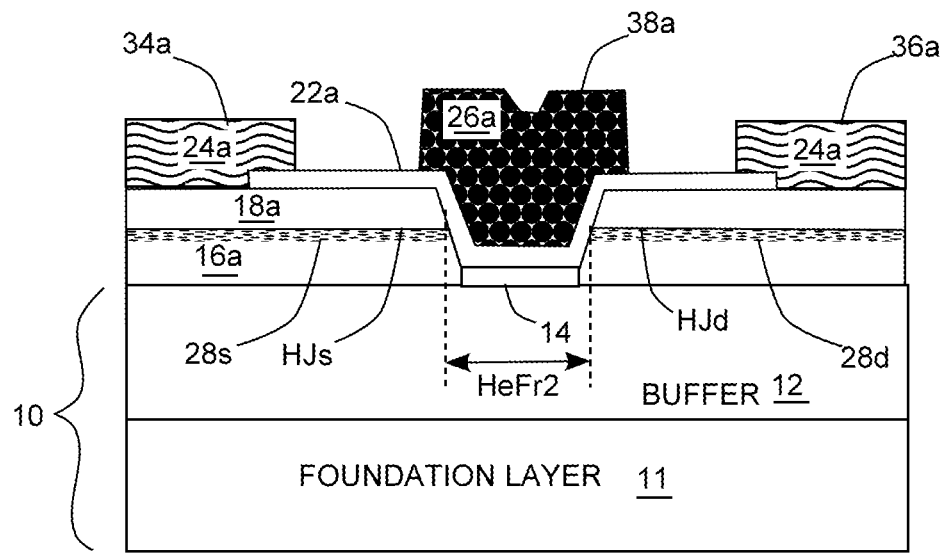

FIGS. 10-13 illustrate the sequential steps of fabricating another normally-off HEMT, where FIG. 13 shows the normally-off HEMT completed. FIGS. 10-13 are drawn on the assumption that several HEMTs are being jointly fabricated on a single template 10, even though only one normally-off HEMT is shown in FIG. 13.

The fabrication of this normally-off HEMT starts with the template 10 in FIG. 2, where an antigrowth portion 14 is formed on a template 10 including a buffer 12 and a foundation layer 11. As aforementioned, the antigrowth portion 14 could be a dielectric layer deposited and patterned. Alternatively, ion bombardment or laser sintering that damages the crystal structure of the buffer 12 in a selected area could also be used to form the antigrowth portion 14.

Figure 10:
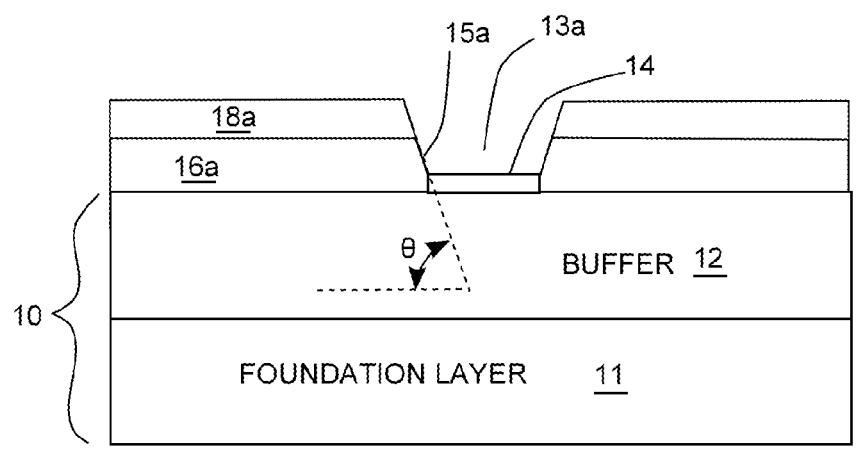
FIGS. 10-13 illustrate the sequential steps of fabricating another normally-off HEMT.

The step used in FIG. 10 follows the step used in FIG. 2. A channel layer 16a as a first semiconductor layer is expitaxially grown on the buffer 12, and a barrier layer 18a as a second semiconductor layer follows to be grown thereon, as shown in FIG. 10. Both the channel layer 16a and the barrier layer 18a could be made of the materials as those for the channel layer 16 and the barrier layer 18 in FIG. 7, respectively. In this particular embodiment, the channel layer 16a is un-doped GaN, the barrier layer 18a is un-doped AlGaN, and both are absent on the antigrowth portion 14.

Unlike the opening 13 in FIG. 3, which has sidewalls 15 bending inward, the opening 13a in FIG. 10 has sidewalls 15a bending outward. The opening 13a has a bottom made up by the antigrowth portion 14. The sidewalls 15a are made up by the channel layer 16a and the barrier layer 18a. Growth conditions for the channel layer 16a should be carefully chosen, so, as the thickness of the channel layer 16a increases, the top view of the opening 13a enlarges, and the sidewalls 15a of the opening 13a bend outward. $\theta$, as denoted in FIG. 10, is the angle of one sidewall 15a of the opening 13a with respect to the top surface of the buffer 12. In practice, $\theta$ is between 0 and 90 degree, and preferably, between 30 and 60 degree. FIG. 10 also demonstrates the opening 13a with flat sidewalls 15a in a cross sectional view, but this disclosure is not limited to. As the growth conditions for the channel layer 16a is different from those for the barrier layer 18a, the $\theta$ of the sidewall 15a might be a constant for the channel layer 16a, but could become another constant for the barrier layer 18a, so forms a turning point on one sidewall 15a at the junction between the channel layer 16a and the barrier layer 18a. The growth conditions for the channel layer 16a and the barrier layer 18a might be chosen to form the sidewalls 15a in FIG. 10 as curves in a cross section view.

A dielectric layer 22a is then deposited and patterned on the barrier layer 18a, on the sidewalls 15a of the opening 13a, and on the antigrowth portion 14, as illustrated in FIG. 11. In this embodiment, the dielectric layer 22a is made of silicon dioxide. Processes for forming the dielectric layer 22a include CVD to uniformly deposit a silicon dioxide layer on the barrier layer 18a, on the sidewalls 15a of the opening 13a, and on the antigrowth portion 14 at the bottom of the opening 13a. Lithography and selectively etching remove part of the silicon dielectric layer, and the rest becomes the dielectric layer 22a. Materials other than silicon dioxide are adoptable for the dielectric layer 22a, examples including $SiON_x$, or $SiN_x$.

The step of electroding follows. Shown in FIG. 12, a metal 24a is deposited and patterned to form a drain electrode 36a and a source electrode 34a, both directly contacting the barrier layer 18a to form ohmic contacts. The metal 24a can be made of titanium (Ti), aluminum (Al), or a metal stack. A gate metal 26a is then deposited and patterned to form a gate electrode 38a on the dielectric layer 22a, as illustrated in FIG. 13. The gate metal 26a can be made of a refractory metal or its compound, e.g., Ta, TaN, TiN, Pd, W, or $WSi_2$. As illustrated in FIG. 13, the HEMT therein has three electrodes, consisting of a source electrode 34a and a drain electrode 36a as two channel electrodes, and a gate electrode 38a that controls the conduction between the two channel electrodes.

The barrier layer 18a and the channel layer 16a contacts to form heterojunctions HJd and HJs, creating two-dimensional electron gas regions 28d and 28s respectively. The heterojunctions HJd and HJs are separated by the opening 13a, which now in FIG. 13 is filled with the dielectric layer 22a and the gate electrode 38a. As the opening 13a is defined by the antigrowth portion 14, it is equivalent to say that the antigrowth portion 14 defines a heterojunction-free area HeFr2 in FIG. 13 where the barrier layer 18a is absent and no heterojunction exists. Both the barrier layer 18a and the channel layer 16a are absent in the area where the antigrowth portion 14 locates. Apparently, the heterojunction-free area HeFr2 separates heterojunction HJd from HJs. Due to the existence of the heterojunction-free area HeFr2, the 2DEG regions 28d and 28s are separated, physically and electrically. Normally when there is no bias applied to the gate electrode 38a, no conduction between the source electrode 34a and the drain electrode 36a exists. Therefore, the HEMT in FIG. 13 is a normally-off device.

Figure 14:
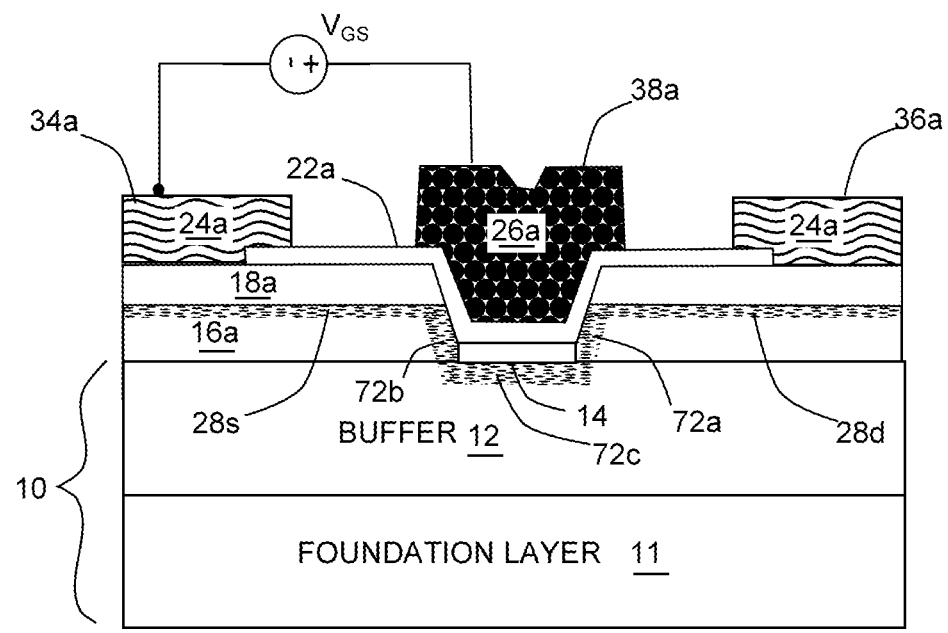
FIG. 14 shows a positive gate-to-source bias $V_{GS}$ applied between the gate electrode and the source electrode of FIG. 13.

A positive gate-to-source bias $V_{GS}$ is applied between the gate electrode 38a and the source electrode 34a in FIG. 14. The gate-to-source bias $V_{GS}$, when exceeding a threshold voltage, attracts and accumulates electrons to form electron regions 72a and 72b in the channel layer 16a and against the opening 13a, and an electron region 72c in the buffer 12 and underneath the antigrowth portion 14. The electron regions 72a, 72b and 72c constitute a conductive path so the drain electrode 36a becomes electrically coupled to the source electrode 34a via the 2DEG region 28d, the electron regions 72a, 72c and 72b, and the 2DEG region 28s. The HEMT in FIG. 14 is therefore turned on.

Figure 18:
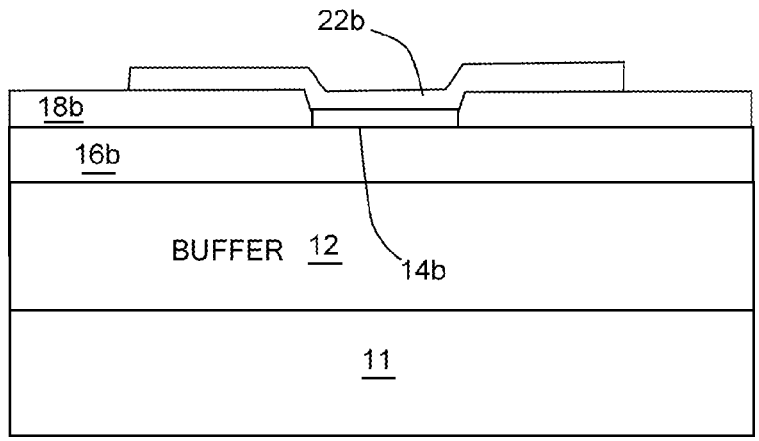
Figure 19:
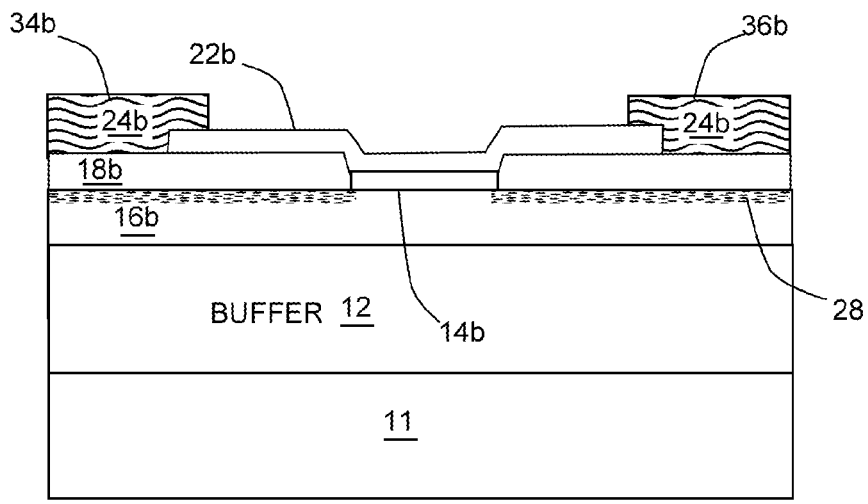
Figure 20:
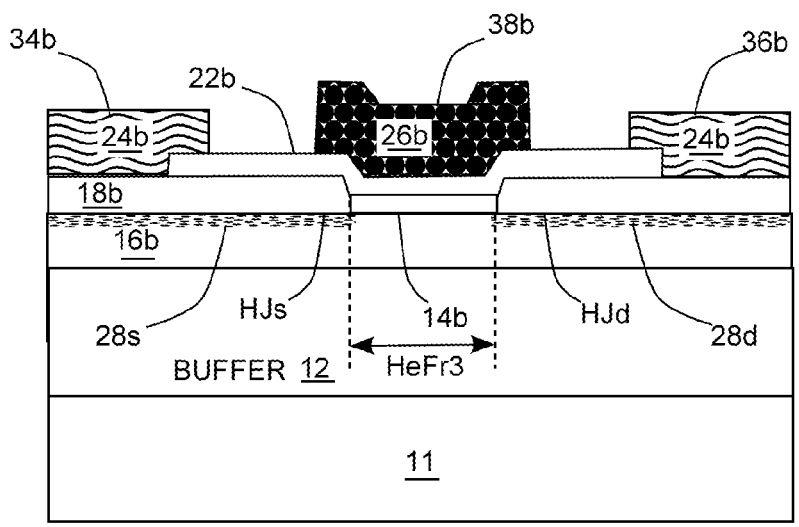

FIGS. 15-20 illustrate the sequential steps of fabricating another normally-off HEMT, where FIG. 20 shows the normally-off HEMT completed. FIGS. 15-20 are also drawn on the assumption that several HEMTs are being jointly fabricated on a single template 10, even though only one normally-off HEMT is shown in FIG. 20.

Figure 15:
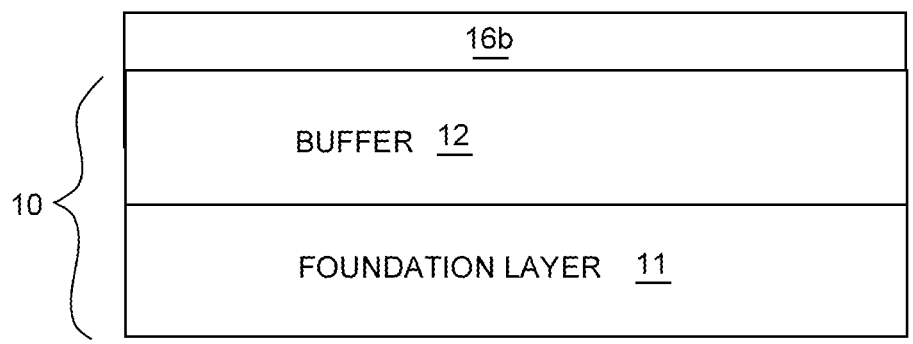
FIGS. 15-20 illustrate the sequential steps of fabricating another normally-off HEMT.

FIG. 15 starts with the formation of a channel layer 16b on a template 10 including a buffer 12 and a foundation layer 11. The channel layer 16b is analogous with the channel layer 16 or 16a, so the materials and the fabrication methods adoptable for it are omitted herein for brevity.

Figure 16:
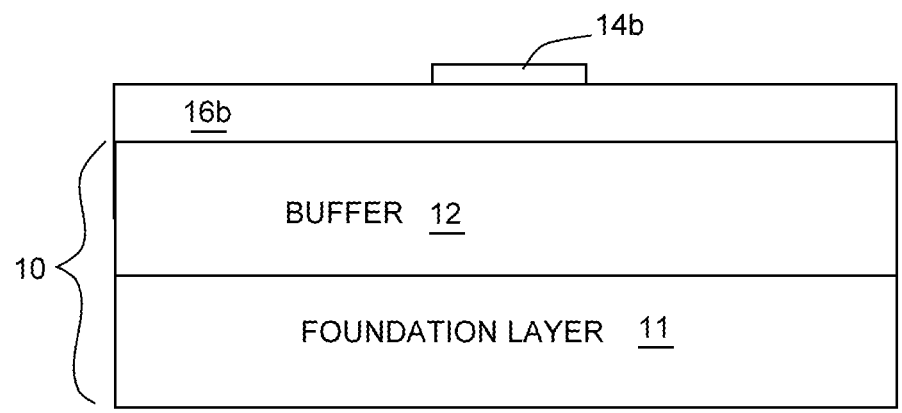

Unlike the antigrowth portion 14 in FIG. 2 or FIG. 10, which rests directly on the buffer 12, the antigrowth portion 14b in FIG. 16 rests directly on the channel layer 16b. The fabrication methods and the materials suitable for the antigrowth portion 14b are omitted herein because they are analogous with those for the antigrowth portion 14.

Figure 17:
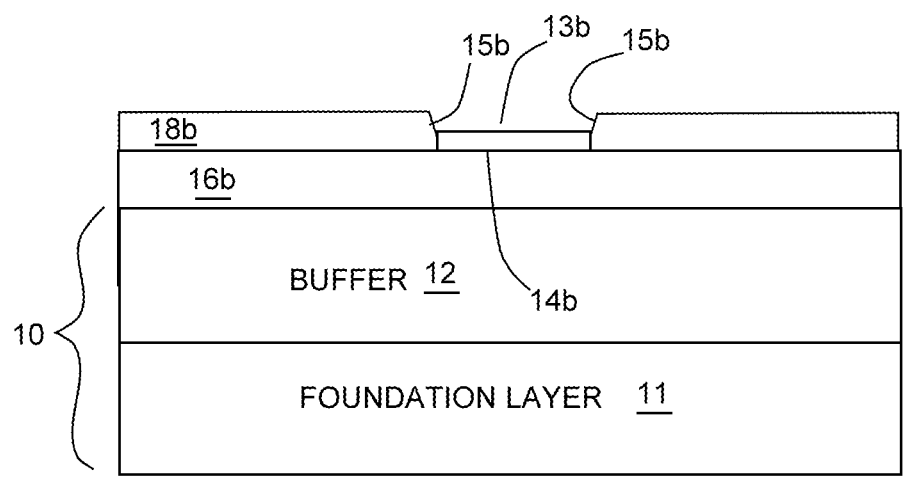

A barrier layer 18b, analogous with the barrier layer 18a, is then grown on the channel layer 16b, as shown in FIG. 17. The barrier layer 18b is absent over the antigrowth portion 14b, forming an opening 13b with a bottom made up by the antigrowth portion 14b and sidewalls 15b made up by the barrier layer 18b. Growth conditions for the barrier layer 18b is carefully chosen, so, as the thickness of the barrier layer 18b increases, the top view of the opening 13b enlarges and the sidewalls 15b of the opening 13a bend outward. The sidewalls 15b are made up by the barrier layer 18b only. In other embodiments, the sidewalls 15b could be vertical to the top surface of the channel layer 16b, implying the top view of the opening 13b is about constant independent to the thickness of the barrier layer 18b.

The fabrication methods associated with FIGS. 18, 19 and 20 are analogous with those associated with FIGS. 11, 12 and 13, and, as they are understandable based on the aforementioned teaching, their explanations are omitted herein.

Due to the existence of the antigrowth portion 14b, the barrier layer 18b does not grow on the heterojunction-free area HeFr3 where the antigrowth portion 14b covers, as shown in FIG. 20. Inside the heterojunction-free area HeFr3, no heterojunction exists. As a result, the HEMT in FIG. 20 has the 2DEG regions 28d and 28s separated from each other by the heterojunction-free area HeFr3, and becomes a normally-off device.

Figure 21:
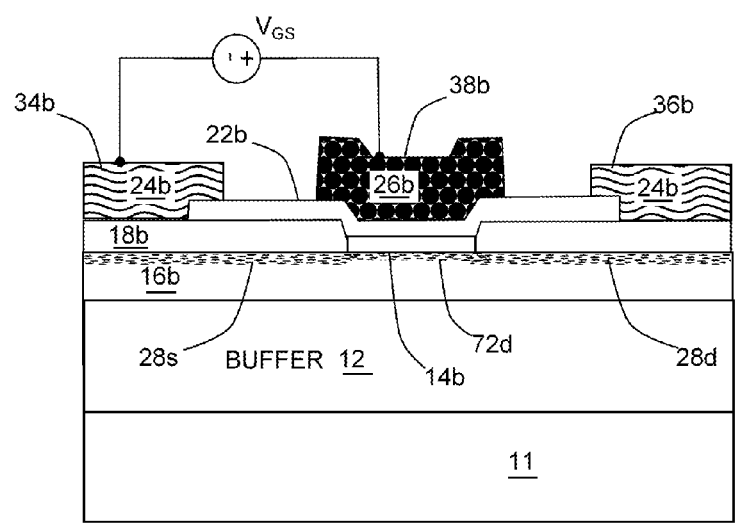
FIG. 21 shows a positive gate-to-source bias $V_{GS}$ applied between the gate electrode and the source electrode of FIG. 20.

A positive gate-to-source bias $V_{GS}$ is applied between the gate electrode 38b and the source electrode 34b in FIG. 21, to form an electron region 72d underneath the gate electrode 38b and the antigrowth portion 14b. The electron region 72d provides a conductive path so the drain electrode 36b becomes electrically coupled to the source electrode 34b via the 2DEG region 28d, the electron region 72d and the 2DEG region 28s. The HEMT in FIG. 21 is therefore turned on.

While the present disclosure has been described by way of example and in terms of preferred embodiment, it is to be understood that the present disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A normally-off field-effect semiconductor device, comprising:
    a template;
    an antigrowth portion on the template, comprising:
        a top portion, opposite to the template; and
        a side portion, connecting to the top portion;
    a first semiconductor layer of a first semiconducting material on the template;
    a second semiconductor layer of a second semiconducting material on the first semiconductor layer, wherein the first and second semiconductor layers forming two heterojunctions for creating two-dimensional electron gas regions;
    a heterojunction-free area defined by the antigrowth portion, for separating the heterojunctions;
    two channel electrodes on the second semiconductor layer; and
    a gate electrode on the second semiconductor layer and above the antigrowth portion,
    wherein the top portion and the side portion of the antigrowth portion are directly connected to different materials.

2. The normally-off field-effect semiconductor device of claim 1, comprising a dielectric layer on the second semiconductor layer and above the antigrowth portion.

3. The normally-off field-effect semiconductor device of claim 1, comprising:

an air gap sealed under the second semiconductor layer and above the antigrowth portion.

4. The normally-off field-effect semiconductor device of claim 3, comprising:
   an opening with a bottom made up by the antigrowth portion and sidewalls made up by the second semiconductor layer;
   wherein the opening is filled with the dielectric layer and the gate electrode.

5. The normally-off field-effect semiconductor device of claim 4, wherein the sidewalls are made up by the first and second semiconductor layers.

6. The normally-off field-effect semiconductor device of claim 1, wherein the antigrowth portion is made from an insulating material.

7. The normally-off field-effect semiconductor device of claim 1, wherein the antigrowth portion is made by ion bombardment or laser sintering.

8. The normally-off field-effect semiconductor device of claim 1, wherein the first semiconductor layer is absent in the heterojunction-free area.

9. The normally-off field-effect semiconductor device of claim 1, wherein the second semiconductor layer is absent in the heterojunction-free area.

10. The normally-off field-effect semiconductor device of claim 1, wherein the template comprises a foundation layer and a buffer.

11. The normally-off field-effect semiconductor device of claim 1, wherein the top portion is directly connected to a dielectric layer.

12. A normally-off field-effect semiconductor device, comprising:
    a template;
    an antigrowth portion on the template;
    a first semiconductor layer of a first semiconducting material on the template;
    a second semiconductor layer of a second semiconducting material on the first semiconductor layer, wherein the first and second semiconductor layers forming two heterojunctions for creating two-dimensional electron gas regions;
    a heterojunction-free area defined by the antigrowth portion, for separating the heterojunctions;
    two channel electrodes on the second semiconductor layer; and
    a gate electrode on the second semiconductor layer and above the antigrowth portion,
    wherein the first semiconductor layer is absent in the heterojunction-free area.

13. A normally-off field-effect semiconductor device, comprising:
    a template;
    an antigrowth portion on the template;
    a first semiconductor layer of a first semiconducting material on the template;
    a second semiconductor layer of a second semiconducting material on the first semiconductor layer, wherein the first and second semiconductor layers forming two heterojunctions for creating two-dimensional electron gas regions;
    a heterojunction-free area defined by the antigrowth portion, for separating the heterojunctions;
    two channel electrodes on the second semiconductor layer; and
    a gate electrode on the second semiconductor layer and above the antigrowth portion,
    wherein the second semiconductor layer is devoid of being between the antigrowth portion and the gate electrode.

* * * * *